(12) United States Patent
Konishi et al.

(10) Patent No.: US 8,487,649 B2
(45) Date of Patent: Jul. 16, 2013

(54) OUTPUT CIRCUIT, SYSTEM INCLUDING OUTPUT CIRCUIT, AND METHOD OF CONTROLLING OUTPUT CIRCUIT

(75) Inventors: Kenichi Konishi, Kasugai (JP); Hiroshi Miyazaki, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/351,797

(22) Filed: Jan. 17, 2012

(65) Prior Publication Data
US 2012/0206186 A1  Aug. 16, 2012

(30) Foreign Application Priority Data
Feb. 14, 2011  (JP) ................. 2011-028880

(51) Int. Cl.
*H03K 17/16* (2006.01)
*H03K 19/003* (2006.01)
(52) U.S. Cl.
USPC .................. 326/27; 326/83; 326/26
(58) Field of Classification Search
USPC .............. 326/26–27, 30–34, 56–58, 82–88
See application file for complete search history.

(56) References Cited

U.S. PATENT DOCUMENTS

| | | | |
|---|---|---|---|
| 5,117,129 A | | 5/1992 | Hoffman et al. |
| 6,573,778 B2 * | | 6/2003 | Salome et al. ............ 327/310 |
| 6,947,335 B2 | | 9/2005 | Nakamura |
| 2002/0053934 A1 | | 5/2002 | Salome et al. |
| 2004/0017698 A1 * | | 1/2004 | Huber .................... 365/189.11 |
| 2007/0247192 A1 * | | 10/2007 | Miyazaki ................... 326/83 |
| 2008/0218214 A1 * | | 9/2008 | Morii ........................ 326/83 |
| 2009/0289669 A1 * | | 11/2009 | Seth et al. ................. 327/109 |
| 2010/0315748 A1 | | 12/2010 | Kwong et al. |
| 2012/0206179 A1 * | | 8/2012 | Miyazaki ................... 327/170 |

FOREIGN PATENT DOCUMENTS

| | | |
|---|---|---|
| EP | 0 481 329 A2 | 4/1992 |
| JP | 2003-124798 A | 4/2003 |
| JP | 2009-531934 A | 9/2009 |
| WO | WO-2007/113765 A1 | 10/2007 |

OTHER PUBLICATIONS

Partial European Search Report mailed Mar. 25, 2013 for corresponding European Patent Application No. 12 15 1757.

* cited by examiner

*Primary Examiner* — Jany Richardson
(74) *Attorney, Agent, or Firm* — Fujitsu Patent Center

(57) ABSTRACT

An output circuit includes a first transistor coupled to an external terminal and including a gate terminal that receives a first drive signal. The first transistor drives a potential at the external terminal in accordance with the first drive signal. A first capacitor includes a first end coupled to the gate terminal of the first transistor and a second end coupled to the external terminal. The output circuit also includes a circuit portion coupled to the first transistor. The circuit portion maintains the first transistor in an inactivated state when the gate terminal of the first transistor is in a floating state.

12 Claims, 4 Drawing Sheets

OUTPUT CIRCUIT, SYSTEM INCLUDING OUTPUT CIRCUIT, AND METHOD OF CONTROLLING OUTPUT CIRCUIT

CROSS-REFERENCE TO RELATED APPLICATIONS

This application is based upon and claims the benefit of priority from prior Japanese Patent Application No. 2011-28880, filed on Feb. 14, 2011, the entire contents of which are incorporated herein by reference.

FIELD

The present application relates to an output circuit, a system including the output circuit, and a method of controlling the output circuit.

BACKGROUND

Communication among a plurality of devices is, for example, conventionally carried out by serial communication. Such devices include an open-drain type output circuit (see Japanese Patent Publication No. 2009-531934).

As illustrated in FIG. 1, a plurality of devices 11, 12, and 13 is mutually coupled by a transmission path 14 which transmits and receives data. The device 13 includes an output circuit 15 which outputs data. Although not illustrated, other devices 11 and 12 also include a similar output circuit.

The output circuit 15 is an open drain type driver circuit. A resistor R1 pulls up a potential level of the transmission path 14. The device 13 activates an N-channel MOS transistor T1, which is coupled to an external terminal P0, to pull down the potential level of the transmission path 14, which is coupled to the external terminal P0. Thus, the voltage Vc of the signal propagated through the transmission path 14 is changed, as illustrated in FIG. 2A.

In this manner, the output circuit 15 activates the N-channel MOS transistor T1 to change the potential of the transmission path 14 from H level to L level. A waveform shaping capacitor C1 may be coupled between a gate and a drain of the transistor T1 to adjust the slope of the fall edge of the potential level in the transmission path 14.

In the above system, when the communication is performed between two devices 11 and 12, the power supply of the device 13 that does not perform the communication may be turned off. When the power supply of the device 13 is turned off, the supply of high potential voltage VDE to an inverter circuit 16, for example, is stopped. In this case, a gate terminal of the transistor T1 is in a floating state. Thus, when the power supply of the device 13 is turned off, the gate terminal of the transistor T1 of the output circuit 15 is AC coupled with the transmission path 14 through the waveform shaping capacitor C1. Therefore, when the potential of the transmission path 14 changes from L level to H level, the gate voltage of the transistor T1 also rises. The transistor T1 is then weakly activated. As a result, the waveform of the voltage Vc in the transmission path 14 changes, as illustrated in FIG. 2B. That is, the signal waveform propagated through the transmission path 14 changes undesirably.

SUMMARY

According to one aspect, an output circuit includes a first transistor coupled to an external terminal and including a gate terminal that receives a first drive signal. The first transistor drives a potential at the external terminal in accordance with the first drive signal. A first capacitor includes a first end coupled to the gate terminal of the first transistor and a second end coupled to the external terminal. The output circuit also includes a circuit portion coupled to the first transistor. The circuit portion maintains the first transistor in an inactivated state when the gate terminal of the first transistor is in a floating state.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE EMBODIMENTS

The embodiments of an output circuit, a system including the output circuit, and a method of controlling the output circuit will be described according to the accompanying drawings.

System Configuration

Figure 3:
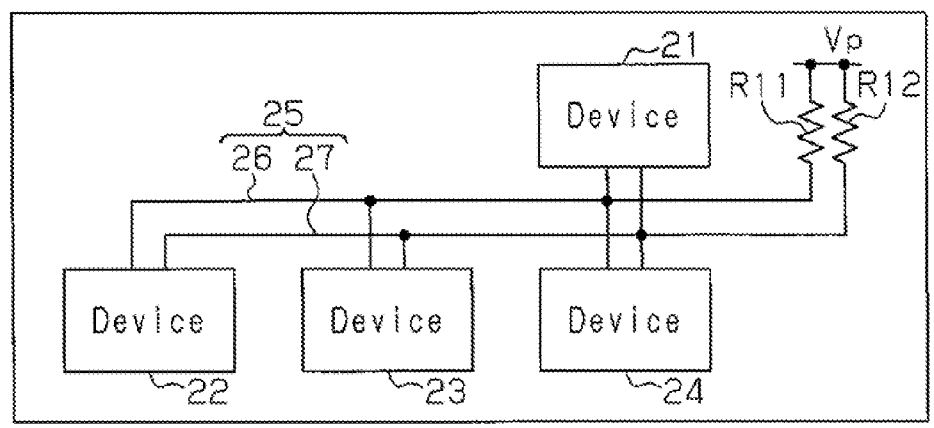
FIG. 3 is a schematic circuit block diagram of a system including an output circuit.

As illustrated in FIG. 3, an electronic system includes a plurality of (four in FIG. 3) of devices 21, 22, 23, and 24. The devices 21 to 24 are coupled to each other by a bus 25.

The devices 21 to 24 are formed to transmit and receive signals and data with each other through the bus 25 in accordance with a given synchronous serial communication. The synchronous serial communication is, for example, an Inter Integrated Circuit communication. In the case of such a communication method, the bus 25 includes, for example, a first transmission path 26, which transmits a clock signal, and a second transmission path 27, which transmits data. For example, each of the transmission paths 26 and 27 is a cable or a pattern wiring formed on a substrate.

A resistor R11 is arranged on the first transmission path 26. The resistor R11 includes a first terminal coupled to the first transmission path 26 and a second terminal supplied with a voltage Vp. Thus, the resistor R11 pulls up a potential level in the first transmission path 26. A resistor R12 is arranged on the second transmission path 27. The resistor R12 includes a first terminal coupled to the second transmission path 27 and a second terminal supplied with the voltage Vp. Thus, the resistor R12 pulls up a potential level in the second transmission path 27.

At least one of the devices 21 to 24 is formed to operate as a master device. For example, the master device is a microcontroller that generates a clock signal for data transfer and outputs the clock signal to the first transmission path 26. The master device starts and terminates the data transfer on the bus. The device whose address is instructed by the master device is called a slave device. For example, the device 21 is the master device, and the devices 22 to 24 are the slave devices.

Example of Device Structure

Figure 4:
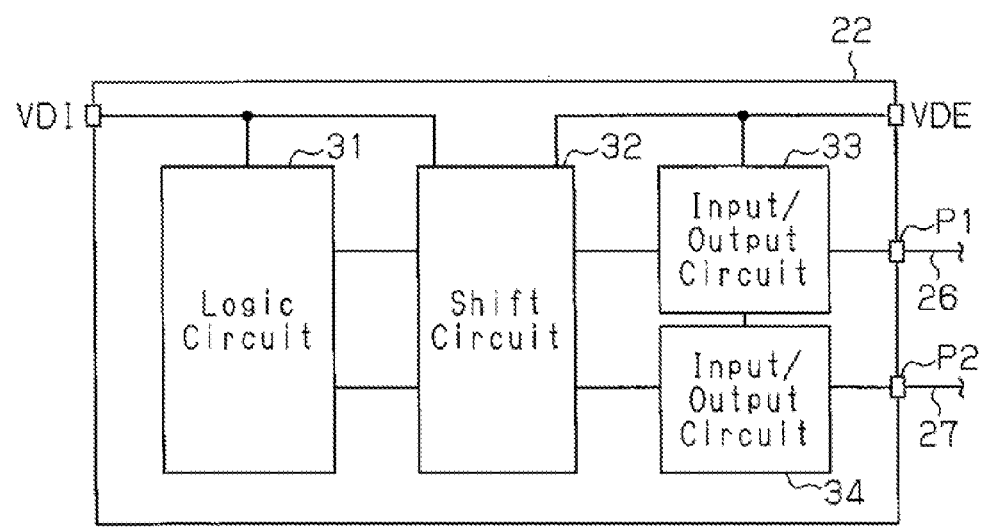
FIG. 4 is a schematic block diagram of a device.

As illustrated in FIG. 4, the device 22 includes a logic circuit 31 that operates by a first high potential voltage VDI. The logic circuit 31 is coupled to an input/output circuit 33 that operates by a second high potential voltage VDE through a shift circuit 32. The shift circuit 32 shifts a level of the signal, which is output from the logic circuit 31, to a level of the signal, which is handled by the input/output circuits 33 and 34. Further, the shift circuit 32 shifts a level of the signal, which is output from the input/output circuits 33 and 34, to a level of the signal, which is handled by the logic circuit 31.

The logic circuit 31 includes, for example, a CPU, or the like, and has a data processing function and a communication control function. The input/output circuit 33 pulls down a potential level in the transmission path 26 coupled to an external terminal P1 based on a signal provided from the logic circuit 31 through the shift circuit 32. The input/output circuit 33 outputs a signal based on the change in the potential level of the transmission path 26 to the shift circuit 32. The input/output circuit 34 pulls down a potential level in the transmission path 27 coupled to an external terminal P2 based on a signal provided from the logic circuit 31 through the shift circuit 32. The input/output circuit 34 outputs a signal based on the change in the potential level of the transmission path 27 to the shift circuit 32.

An example of the structure of the input/output circuit 34 will now be described.

First Embodiment

Figure 5:
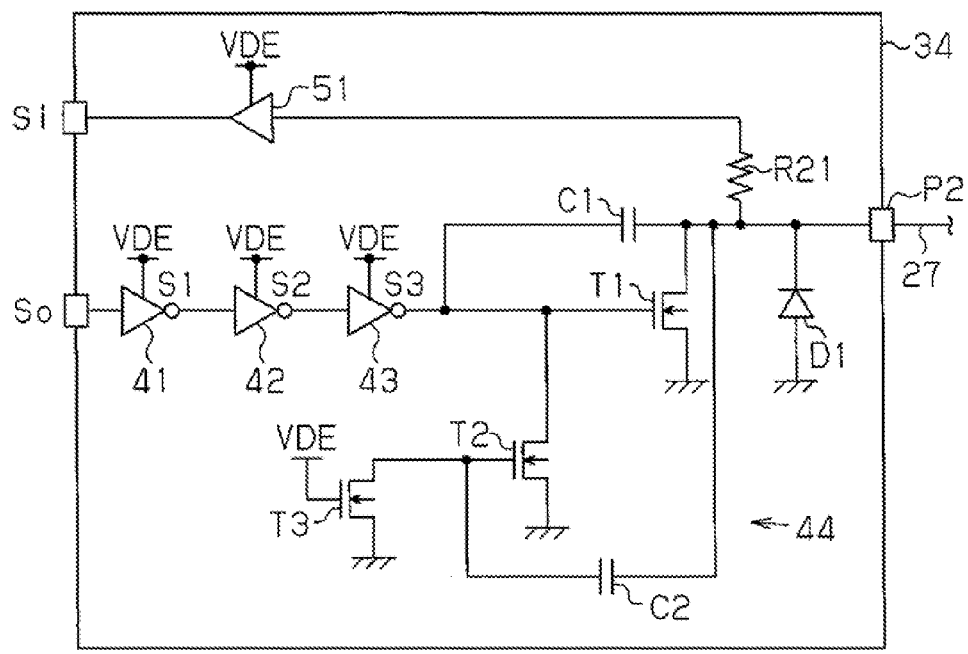
FIG. 5 is a schematic circuit diagram of an input/output circuit of a first embodiment.

As illustrated in FIG. 5, the input/output circuit 34 includes inverter circuits 41 to 43. A signal So is provided to the inverter circuit 41 based on a signal output from the shift circuit 32 illustrated in FIG. 4. An output terminal of the inverter circuit 41 is coupled to an input terminal of the inverter circuit 42. An output terminal of the inverter circuit 42 is coupled to an input terminal of the inverter circuit 43. The inverter circuits 41 to 43 coupled in series in this manner operate by the high potential voltage VDE supplied as a drive voltage.

An output terminal of the inverter circuit 43 is coupled to a pull-down transistor T1. The transistor T1 is an N-channel MOS transistor and includes a gate terminal coupled to the output terminal of the inverter circuit 43, a source terminal coupled to the wiring supplied with a low potential voltage (reference potential, e.g., ground potential), and a drain terminal coupled to the external terminal P2. In the present embodiment, the wiring supplied with the low potential voltage is the ground. Furthermore, a waveform shaping capacitor C1 is coupled to the transistor T1. The capacitor C1 includes a first terminal coupled to the drain terminal of the transistor T1 and a second terminal coupled to the gate terminal of the transistor T1. The capacitor C1 has a capacitance value that is set such that the slope of the fall (Fall-rate) of the potential level of the transmission path 27 conforms to the provision of the communication.

The external terminal P2 is coupled to a cathode of a diode D1. An anode of the diode D1 is coupled to the ground. The diode D1 is arranged as a protective element from en electrostatic discharge (ESD).

A first terminal of the capacitor C2 is coupled to the external terminal P2. A second terminal of the capacitor C2 is coupled to the transistor T2. The capacitor C2 has a capacitance value that is set to, for example, about 1/10 of the capacitance value of the capacitor C1.

The transistor T2 has the same conductivity type as the pull-down transistor T1. In the present example, the transistor T2 is an N-channel MOS transistor. The transistor T2 includes a gate terminal coupled to the second terminal of the capacitor C2, a source terminal coupled to the ground, and a drain terminal coupled to the gate terminal of the transistor T1 (i.e., second terminal of capacitor C1).

The gate terminal of the transistor T2 is coupled to a transistor T3. The transistor T3 has the same conductivity type as the transistors T1 and T2. In the present example, the transistor T3 is an N-channel MOS transistor. The transistor T3 includes a drain terminal coupled to the gate terminal of the transistor T2, a source terminal coupled to the ground, and a gate terminal supplied with the high potential voltage VDE.

A first terminal of the resistor R21 is coupled to the external terminal P2. A second terminal of the resistor R21 is coupled to an input terminal of a buffer circuit 51. The buffer circuit 51 is, for example, a Schmidt trigger gate. The buffer circuit 51 operates by the high potential voltage VDE supplied as a drive voltage. An output signal Si of the buffer circuit 51 is provided to the logic circuit 31 through the shift circuit 32 illustrated in FIG. 4.

Although FIG. 5 illustrates the input/output circuit 34 for driving the transmission path 27, the input/output circuit 33 for driving the transmission path 26 illustrated in FIG. 4 is also similarly formed.

The operation of the input/output circuit 34 formed as above will now be described.

[When High Potential Voltage VDE is Supplied to Input/Output Circuit 34]

When the power supply (high potential voltage VDE) is supplied to the input/output circuit 34 of the device 22, the transistor T3 is activated by the high potential voltage VDE to set the gate voltage of the transistor T2 to ground level. Thus, the transistor T2 is inactivated.

When the signal So is H level, the inverter circuit 43 provides the signal S3 of L level to the gate terminal of the transistor T1. The transistor T1 is inactivated in response to the signal S3 of L level. In this case, the potential level of the transmission path 27 is pulled up by the resistor R12 illustrated in FIG. 3. That is, the potential of the transmission path 27 becomes H level.

When the signal So falls from H level to L level, the inverter circuit 43 raises the gate voltage of the transistor T1 from L level. Generally, the inverter circuit 43 is formed by a high potential side transistor, which is coupled to the wiring supplied with the high potential voltage, and a low potential side transistor, which is coupled to the ground. In the present example, the inverter circuit 43 further includes a resistor element (not illustrated) coupled between the output terminal of the inverter circuit 43 and the high potential side transistor. In this structure, when the high potential side transistor of the inverter circuit 43 is activated, the resistor element of the inverter circuit 43 gradually raises the gate voltage of the transistor T1. That is, the current supplied to the gate terminal of the transistor T1 is set by the resistor element.

The transistor T1 is activated when the gate voltage of the transistor T1 reaches the threshold voltage of the transistor T1. The drain current of the transistor T1 gradually increases according to the rise in the gate voltage of the transistor T1. This gradually pulls down the potential level of the transmission path 27.

[When High Potential Voltage VDE is not Supplied to Input/Output Circuit 34]

When the power supply (high potential voltage VDE) is not supplied to the input/output circuit 34 of the device 22, the transistor T3 is inactivated and the gate terminal of the transistor T2 is in a floating state.

The potential level of the transmission path 27 is pulled down by the operation of another device (e.g., device 23 illustrated in FIG. 3) and set to L level. When the pull down transistor (T1) of another device is inactivated, the potential level of the transmission path 27 is pulled up by the resistor R12 (see FIG. 3) and raised from L level to H level.

The gate terminal of the transistor T1 illustrated in FIG. 5 is AC coupled with the external terminal P2 through the capacitor C1. Therefore, the gate voltage of the transistor T1 rises according to the rise in the potential level of the transmission path 27. The gate terminal of the transistor T2 is also AC coupled with the external terminal P2 through the capacitor C2. Therefore, the gate voltage of the transistor T2 rises according to the rise in the potential level of the transmission path 27.

The parasitic capacitance of the transistor T2 is sufficiently small compared to the parasitic capacitance of the gate of the transistor T1. Thus, the capacitance value of the capacitor C2 may be set smaller than the capacitance value of the capacitor C1. In the present example, the capacitance value of the capacitor C2 is set to about 1/10 of the capacitance value of the capacitor C1, as described above. Thus, the gate voltage of the transistor T2 rises faster than the gate voltage of the transistor T1. As a result, the transistor T2 is activated before the transistor T1. The transistor T2 that is activated couples the gate terminal of the transistor T1 to the wiring supplied with the low potential voltage (ground potential). The transistor T2 and the capacitor C2 are included in a pull-down circuit 44 that pulls down the potential at the gate terminal of the transistor T1. The pull-down circuit 44 is an example of a circuit portion that maintains the transistor T1 in an inactivated state when the gate terminal of the transistor T1 is in the floating state.

As described above, the transistor T2 that is activated by the terminal voltage of the capacitor C2 couples the second terminal of the capacitor C1, which is coupled to the gate terminal of the transistor T1, to the ground. As a result, the charges of the capacitor C1 which are charged by the rise in the potential level of the transmission path 27 flow toward the ground, thus pulling down the gate voltage of the transistor T1 to the ground level. Therefore, the transistor T1 maintains the inactivated state.

Figure 1:
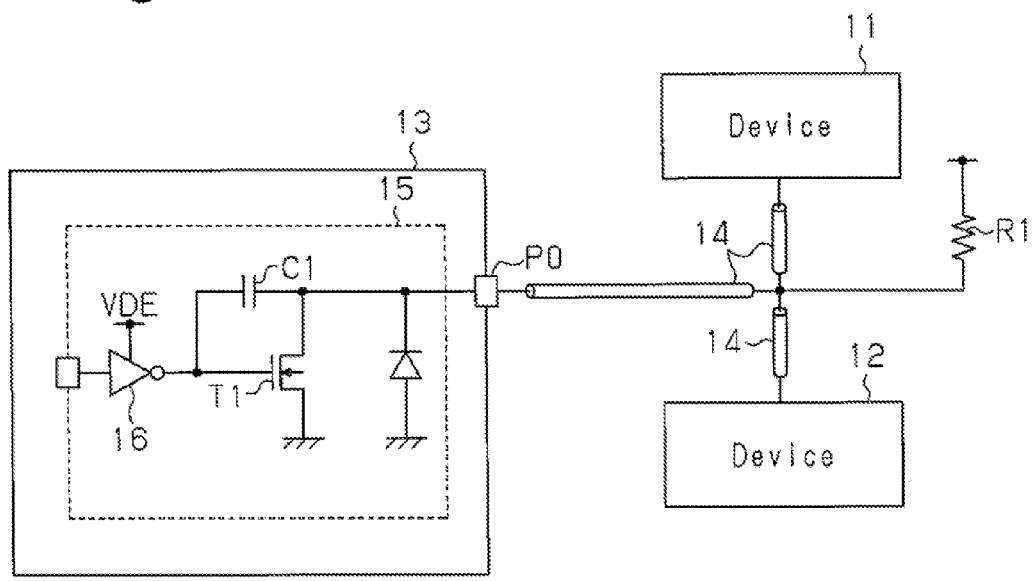
FIG. 1 is a schematic circuit block diagram of a system including an output circuit.
Figure 2A:
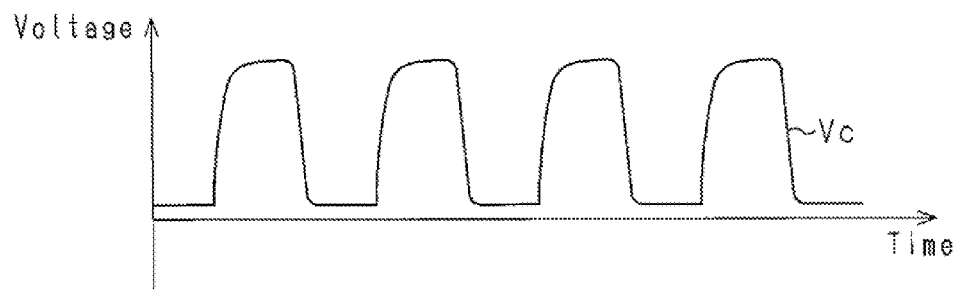
FIGS. 2A and 2B are waveform charts illustrating change in potential level of a transmission path between devices.
Figure 2B:
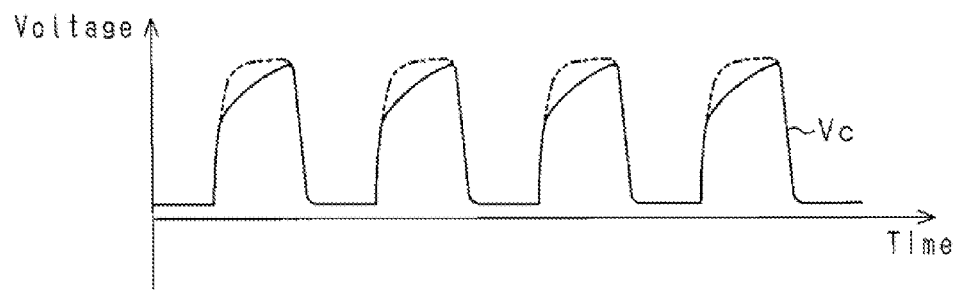
Figure 6:
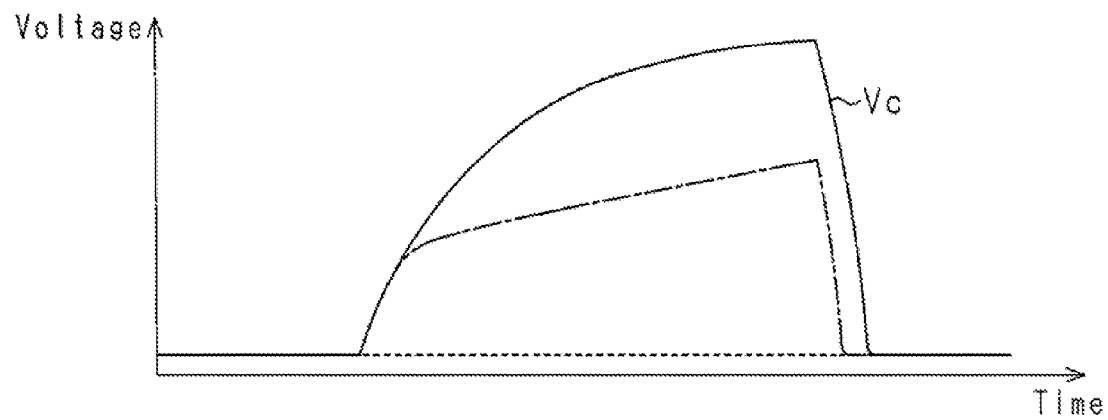
FIG. 6 is a schematic operation waveform chart of the input/output circuit of FIG. 5.

As a result, as illustrated with a solid line in FIG. 6, the voltage Vc of the transmission path 27 changes from L level to H level by the operation of the input/output circuit of another device. In other words, the transistor T1 of the input/output circuit 34 is not activated in an unintended manner and the voltage Vc of the transmission path 27 does not lower to the undesired level even if the power supply of the device 22 is turned off. The waveform illustrated by a dashed line in FIG. 6 indicates the change in waveform obtained by the circuit structure illustrated in FIG. 1.

The output circuit of the first embodiment has the following advantages.

(1) The first transistor T1 is activated and inactivated in response to the signal S3. The transistor T1 that is activated pulls down the potential level in the transmission path 27 coupled to the external terminal P2. In this case, the potential level of the transmission path 27 falls at the slope corresponding to the capacitance value of the capacitor C1, which AC couples the gate terminal of the transistor T1 and the external terminal P2.

The pull-down circuit 44 pulls down the gate voltage of the transistor T1 in accordance with the potential at the external terminal P2 and inactivates the transistor T1. Thus, the rising waveform of the potential level in the transmission path 27 coupled to the external terminal P2 is suppressed from undesirably changing.

(2) The transistor T3 is coupled to the gate terminal of the transistor T2. The high potential voltage VDE is supplied to the gate terminal of the transistor T3. When the high potential voltage VDE is supplied, the transistor T3 is activated, thereby pulling down the gate voltage of the transistor T2. Therefore, when the high potential voltage VDE is supplied, the transistor T2 is inactivated and the signal S3 activates and inactivates the transistor T1.

Second Embodiment

A second embodiment of an output circuit (input/output circuit) that pulls down the potential level of the transmission path 27 will now be described. In the second embodiment, the same reference numerals are denoted on similar members as in the first embodiment illustrated in FIG. 5, and the description thereof will be entirely or partially omitted.

Figure 7:
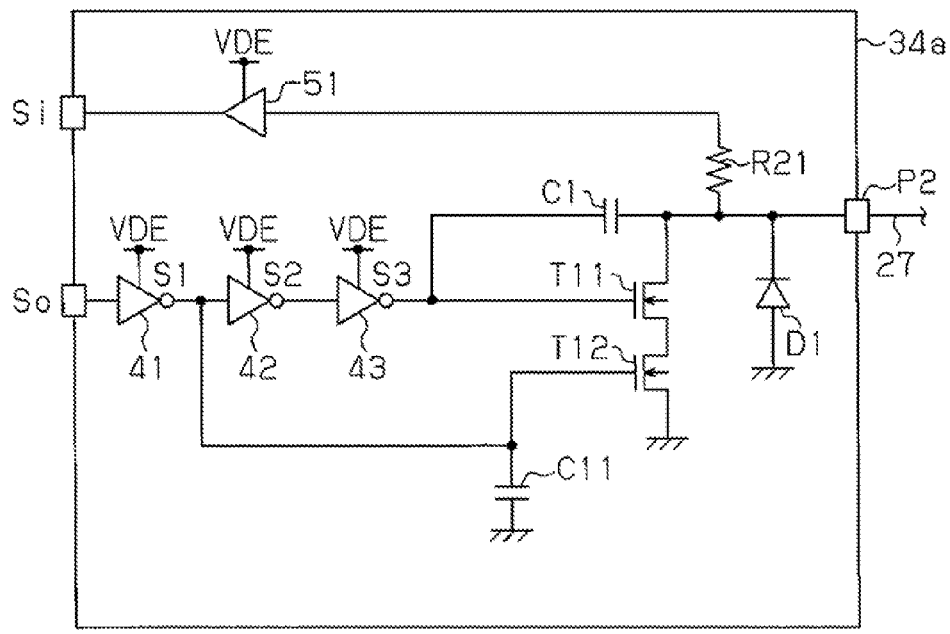
FIG. 7 is a schematic circuit diagram of an input/output circuit of a second embodiment.

As illustrated in FIG. 7, an input/output circuit 34a includes two transistors T11 and T12 that are cascade coupled, or series coupled. The first transistor T11 and the second transistor T12 are the same conductivity type as the transistor T1 illustrated in FIG. 5, that is, the N-channel MOS transistors. The drain terminal of the first transistor T11 is coupled to the external terminal P2. The source terminal of the first transistor T11 is coupled to the drain terminal of the second transistor T12. The source terminal of the second transistor T12 is coupled to the wiring supplied with the low potential voltage (reference potential, e.g., ground potential). The wiring supplied with the low potential voltage is the ground in the present embodiment.

The first transistor T11 and the second transistor T12 are formed to pull down the potential level of the transmission path 27, similar to the transistor T1 illustrated in FIG. 3. For example, the gate width of each of transistors T11 and T12 is set to be twice the gate width of the transistor T1 (FIG. 5) so that the current substantially equal to the switching current flowing from the external terminal P2 towards the ground when the transistor T1 (FIG. 5) is activated flows to the transistors T11 and T12.

The gate terminal of the first transistor T11 is coupled to the output terminal of the inverter circuit 43. The waveform shaping capacitor C1 is coupled between the gate terminal and the drain terminal of the first transistor T11.

The gate terminal of the second transistor T12 is coupled to the output terminal of the inverter circuit 41. The gate terminal of the second transistor T12 is also coupled to a first terminal of the capacitor C11. A second terminal of the capacitor C11 is coupled to the ground. In the second embodiment, the inverter circuit 43 is an example of a first gate circuit, the inverter circuit 41 is an example of a second gate circuit, the signal S3 is an example of a first drive signal, and the signal S1 is an example of a second drive signal. In the second embodiment, the second transistor T12 and the capacitor C11 form a circuit portion that maintains the first transistor T11 in an inactivated state when the gate terminal of the first transistor T11 is in the floating state.

Although FIG. 7 illustrates the input/output circuit 34a for driving the transmission path 27, the input/output circuit 33 for driving the transmission path 26 illustrated in FIG. 4 is also similarly formed.

The operation of the input/output circuit 34a formed as above will now be described.

When the high potential voltage VDE is supplied to the input/output circuit 34a of the device 22, the output signal S1 of the inverter circuit 41 responding to the signal So is provided to the gate terminal of the second transistor T12. Further, the output signal S1 of the inverter circuit 41 is provided to the gate terminal of the first transistor T11 as the signal S3 through the two inverter circuits 42 and 43. Therefore, the signal substantially in phase with respect to each other is provided to the gate terminal of the first transistor T11 and the gate terminal of the second transistor T12. That is, the first transistor T11 and the second transistor T12 are activated and inactivated substantially in phase. In other words, the signal S1 and the signal S3 involve a substantially similar logical change. The first and second transistors T11 and T12 that are activated pull down the potential level of the transmission path 27.

Figure 8A:
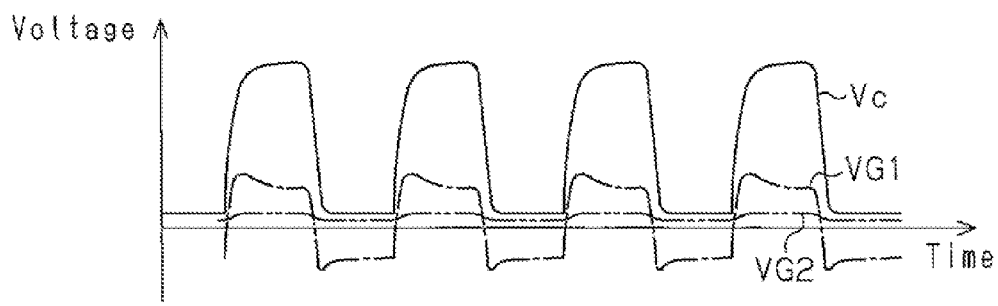
FIG. 8A is a schematic operation waveform chart of the input/output circuit of FIG. 7.
Figure 8B:
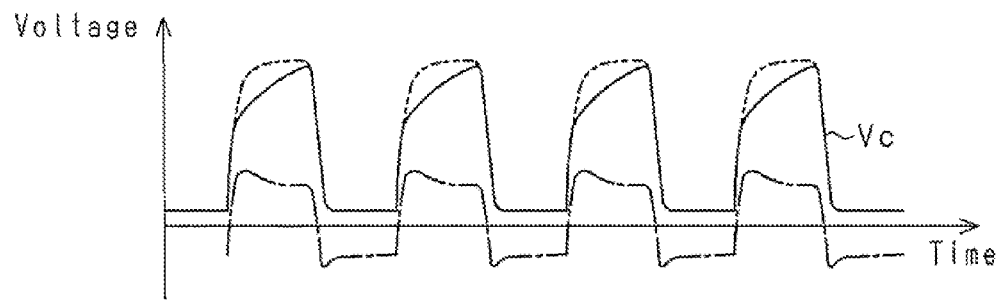
FIG. 8B is a schematic operation waveform chart of the input/output circuit, where a solid line indicates the operation waveform of the input/output circuit of FIG. 1, and a dashed line indicates the waveform of the gate voltage of the transistor T1 of the input/output circuit of FIG. 5.

When the high potential voltage VDE is not supplied to the input/output circuit 34a of the device 22, the gate terminal of the first transistor T11 is in the floating state. Thus, when the potential level of the transmission path 27 changes by the operation of another device, the gate voltage VG1 of the first transistor T11 fluctuates, as illustrated by a dashed line in FIG. 8A, due to the AC coupling of the waveform shaping capacitor C1. The dashed line illustrated in FIG. 8B indicates the waveform of the gate voltage of the transistor T1 illustrated in FIG. 5.

The gate voltage VG2 of the second transistor T12 is AC coupled to the ground via the capacitor C11. Thus, as illustrated by a double-dashed line in FIG. 8A, the gate voltage VG2 of the second transistor T12 is held at a stable potential (around ground level). The gate voltage VG2 does not exceed the threshold voltage of the second transistor T12. Therefore, the second transistor T12 continues the inactivated state.

The output circuit of the second embodiment has the following advantages.

(1) The first transistor T11 and the second transistor T12 are coupled in series between the external terminal P2 and the ground. The first transistor T11 is activated and inactivated in response to the signal S3 output from the inverter circuit 43. The second transistor T12 is activated and inactivated in response to the signal S1 output from the inverter circuit 41. The waveform shaping capacitor C1 is coupled between the gate terminal of the first transistor T11 and the external terminal P2. The gate terminal of the second transistor T12 is coupled to the ground via the capacitor C11.

When the high potential voltage VDE is not supplied, the capacitor C11 holds the gate voltage of the transistor T12 at around the ground level. As a result, the transistor T12 is inactivated. Thus, even if the potential level in the transmission path 27 coupled to the external terminal P2 changes by the operation of another device and the gate voltage of the first transistor T11 fluctuates by the AC coupling of the capacitor C1, the second transistor T12 continues the inactivated state. This suppresses the first transistor T11 from being activated in an unintended manner. In other words, the waveform of the voltage Vc of the transmission path 27 is suppressed from undesirably changing.

It should be apparent to those skilled in the art that the aforementioned embodiments may be embodied in many other forms without departing from the spirit or scope of the invention. Particularly, it should be understood that the aforementioned embodiments may be embodied in the following forms.

The output circuit may be formed by combining the structure illustrated in FIG. 5 (transistors T2 and T3 and capacitor C2) and the structure illustrated in FIG. 7 (transistor T12 and capacitor C11). For example, the input/output circuit 34a illustrated in FIG. 5 may further include the transistor T12 and the capacitor C11 illustrated in FIG. 7.

The input/output circuit 34 (or 34a) may be formed as an output circuit omitting the function of the input circuit (resistor R21 and buffer circuit 51) from the circuit 34 (or 34a).

The transistors that form the input/output circuit 34 (or 34a) are not limited to the MOS transistors, and may be bipolar transistors.

The first high potential voltage VDI and the second high potential voltage VDE are illustrated as in FIG. 4. However, the structure of the output circuit (input/output circuit) described above may be applied to the device in which a single voltage is supplied to the logic circuit 31 and the input/output circuit 33.

All examples and conditional language recited herein are intended for pedagogical purposes to aid the reader in understanding the principles of the invention and the concepts contributed by the inventor to furthering the art, and are to be construed as being without limitation to such recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

The invention claimed is:

1. An output circuit comprising:
   a first transistor coupled to an external terminal and including a gate terminal that receives a first drive signal based on a power supply voltage supplied to the output circuit, wherein the first transistor drives a potential at the external terminal in accordance with the first drive signal;
   a first capacitor including a first end coupled to the gate terminal of the first transistor and a second end coupled to the external terminal; and
   a circuit portion coupled to the first transistor, wherein the circuit portion maintains the first transistor in an inactivated state when the power supply voltage is not supplied to the output circuit and the gate terminal of the first transistor is in a floating state.

2. The output circuit according to claim 1, wherein the circuit portion includes a pull-down circuit that pulls down a potential at the gate terminal of the first transistor in accordance with a potential level of the external terminal.

3. The output circuit according to claim 2, wherein the pull-down circuit includes:
   a second transistor including a drain terminal coupled to the gate terminal of the first transistor, a source terminal coupled to a reference potential, and a gate terminal; and a second capacitor including a first end coupled to the external terminal and a second end coupled to the gate terminal of the second transistor.

4. The output circuit according to claim 3, wherein the pull-down circuit further includes a third transistor including a gate terminal supplied with a drive voltage, the third transistor coupled between the gate terminal of the second transistor and the reference potential.

5. The output circuit according to claim 1, wherein the circuit portion includes:
a second transistor including a gate terminal that receives a second drive signal involving a logical change similar to the first drive signal, the second transistor coupled in series with the first transistor between the external terminal and a reference potential; and
a second capacitor including a first end coupled to the gate terminal of the second transistor and a second end coupled to the reference potential,
the output circuit further comprising:
a first gate circuit that generates the first drive signal; and
a second gate circuit that generates the second drive signal.

6. The output circuit according to claim 5, wherein the first gate circuit is a first inverter circuit and the second gate circuit is a second inverter circuit,
the output circuit further comprising a third inverter circuit that receives the second drive signal, which is output from the second inverter circuit,
wherein the first inverter circuit generates the first drive signal based on an output signal, which is output from the third inverter circuit.

7. A system comprising:
a plurality of devices that communicate with each other through a transmission path coupled to an external terminal, each of the plurality of devices including an output circuit, the output circuit including:
a first transistor coupled to the external terminal and including a gate terminal that receives a first drive signal based on a power supply voltage supplied to the output circuit, wherein the first transistor drives a potential at the external terminal in accordance with the first drive signal;
a first capacitor including a first end coupled to the gate terminal of the first transistor and a second end coupled to the external terminal; and
a circuit portion coupled to the first transistor, wherein the circuit portion maintains the first transistor in an inactivated state when the power supply voltage is not supplied to the output circuit and the gate terminal of the first transistor is in a floating state.

8. The system according to claim 7, wherein the circuit portion includes a pull-down circuit that pulls down the potential at the gate terminal of the first transistor in accordance with a potential level of the external terminal.

9. The system according to claim 7, wherein the circuit portion includes:
a second transistor including a gate terminal that receives a second drive signal involving a logical change similar to the first drive signal, the second transistor coupled in series with the first transistor between the external terminal and a reference potential; and
a second capacitor including a first end coupled to the gate terminal of the second transistor and a second end coupled to the reference potential, and
the output circuit further includes:
a first gate circuit that generates the first drive signal, and
a second gate circuit that generates the second drive signal.

10. A method of controlling an output circuit, the output circuit including a first transistor, a first capacitor, and a second transistor, the first transistor coupled to an external terminal and including a gate terminal that receives a first drive signal based on a power supply voltage supplied to the output circuit, the first capacitor including a first end coupled to the gate terminal of the first transistor and a second end coupled to the external terminal, and the second transistor coupled to the first transistor, the method comprising:
driving the first transistor with the first drive signal; and
maintaining the first transistor in an inactivated state by the second transistor when the power supply voltage is not supplied to the output circuit and the gate terminal of the first transistor is in a floating state.

11. The method according to claim 10, wherein:
the driving the first transistor includes activating the first transistor by the first drive signal to pull down a potential at the external terminal; and
the maintaining the first transistor in an inactivated state includes activating the second transistor in accordance with a potential level of the external terminal to pull down a potential at the gate terminal of the first transistor.

12. The method according to claim 10, wherein the first transistor and the second transistor are coupled in series between the external terminal and a reference potential, the output circuit further includes a second capacitor, the second capacitor including a first end coupled to the gate terminal of the second transistor and a second end coupled to the reference potential,
the method further comprising driving the second transistor by a second drive signal involving a logical change similar to the first drive signal.

* * * * *